(12) United States Patent
Prihadi et al.

(10) Patent No.: US 8,307,237 B2
(45) Date of Patent: *Nov. 6, 2012

(54) PRECISION OSCILLATOR FOR AN ASYNCHRONOUS TRANSMISSION SYSTEM

(75) Inventors: Kartika Prihadi, Austin, TX (US); Kenneth W. Fernald, Austin, TX (US)

(73) Assignee: Silicon Laboratories Inc, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/244,666

(22) Filed: Sep. 25, 2011

(65) Prior Publication Data

US 2012/0036389 A1 Feb. 9, 2012

Related U.S. Application Data

(63) Continuation of application No. 12/166,229, filed on Jul. 1, 2008, now Pat. No. 8,055,932, which is a continuation of application No. 10/244,344, filed on Sep. 16, 2002, now Pat. No. 7,395,447.

(51) Int. Cl.
*G06F 1/04* (2006.01)
*G06F 1/12* (2006.01)
*G06F 5/06* (2006.01)
*G06F 1/00* (2006.01)

(52) U.S. Cl. ...................... 713/600; 713/500

(58) Field of Classification Search ........... 713/500, 713/600
See application file for complete search history.

(56) References Cited

U.S. PATENT DOCUMENTS

| 3,961,138 A | 6/1976 | Fellinger |
| 4,097,695 A * | 6/1978 | Grace et al. .................. 370/475 |
| 4,352,053 A | 9/1982 | Oguchi et al. |
| 4,453,834 A * | 6/1984 | Suzuki et al. ................. 368/201 |
| 4,465,379 A * | 8/1984 | Misawa et al. ................ 368/202 |
| 4,479,097 A | 10/1984 | Larson et al. |
| 4,794,589 A | 12/1988 | Finch et al. |
| 4,851,792 A * | 7/1989 | Ochiai et al. ................. 331/176 |

(Continued)

FOREIGN PATENT DOCUMENTS

DE 4304061 8/1994

(Continued)

OTHER PUBLICATIONS

Sundaresan, K.; Allen, P.E.; Ayazi, F.; , "Process and temperature compensation in a 7-MHz CMOS clock oscillator," Solid-State Circuits, IEEE Journal of , vol. 41, No. 2, pp. 433-442, Feb. 2006.*

(Continued)

*Primary Examiner* — Faisal M Zaman
(74) *Attorney, Agent, or Firm* — Cesari & Reed LLP.; R. Michael Reed

(57) ABSTRACT

A precision oscillator for an asynchronous transmission system. An integrated system on a chip with serial asynchronous communication capabilities includes processing circuitry for performing predefined digital processing functions on the chip and having an associated on chip free running clock circuit for generating a temperature compensated clock. An on-chip UART is provided for digitally communicating with an off-chip UART, which off-chip UART has an independent time reference, which communication between the on-chip UART and the off-chip UART is effected without clock recovery. The on-chip UART has a time-base derived from the temperature compensated clock. The temperature compensated clock provides a time reference for both the processing circuitry and the on-chip UART.

18 Claims, 8 Drawing Sheets

U.S. PATENT DOCUMENTS

| | | | |
|---|---|---|---|
| 4,907,225 A | | 3/1990 | Gulick et al. |
| 5,117,206 A * | | 5/1992 | Imamura ............... 331/158 |
| 5,199,105 A * | | 3/1993 | Michael ............... 710/22 |
| 5,241,647 A * | | 8/1993 | Lin et al. ............... 713/501 |
| 5,349,685 A | | 9/1994 | Houlberg |
| 5,398,007 A | | 3/1995 | Yamazaki et al. |
| 5,438,681 A | | 8/1995 | Mensch |
| 5,448,103 A | | 9/1995 | De Wit |
| 5,481,229 A * | | 1/1996 | Connell et al. ............... 331/158 |
| 5,525,936 A * | | 6/1996 | Post et al. ............... 331/47 |
| 5,559,842 A | | 9/1996 | Javitt |
| 5,596,765 A | | 1/1997 | Baum et al. |
| 5,604,467 A | | 2/1997 | Matthews |
| 5,604,870 A | | 2/1997 | Moss |
| 5,642,128 A * | | 6/1997 | Inoue ............... 345/96 |
| 5,668,506 A * | | 9/1997 | Watanabe et al. ............... 331/66 |
| 5,719,782 A | | 2/1998 | Mitsuoka |
| 5,761,255 A | | 6/1998 | Shi |
| 5,881,374 A | | 3/1999 | Osterberg |
| 5,889,441 A | | 3/1999 | Inn |
| 5,986,485 A * | | 11/1999 | O'Sullivan ............... 327/156 |
| 6,188,378 B1 * | | 2/2001 | Yamamoto et al. ............... 345/101 |
| 6,219,303 B1 | | 4/2001 | Morohoshi et al. |
| 6,263,192 B1 * | | 7/2001 | Alderton ............... 455/73 |
| 6,337,605 B1 * | | 1/2002 | Divoux ............... 331/176 |
| 6,377,130 B1 * | | 4/2002 | Haman ............... 331/176 |
| 6,404,246 B1 | | 6/2002 | Estakhri et al. |
| 6,407,641 B1 | | 6/2002 | Williams et al. |
| 6,480,038 B1 | | 11/2002 | Horn |
| 6,515,551 B1 | | 2/2003 | Mar et al. |
| 6,546,063 B1 | | 4/2003 | Lee et al. |
| 6,839,570 B2 | | 1/2005 | Hutchison et al. |
| 6,973,400 B2 * | | 12/2005 | Cahill-O'Brien et al. .... 702/106 |
| 7,315,956 B2 * | | 1/2008 | Jensen et al. ............... 713/500 |
| 7,356,359 B2 | | 4/2008 | Oh |
| 7,385,453 B2 | | 6/2008 | Nervegna |
| 7,395,447 B2 * | | 7/2008 | Prihadi et al. ............... 713/400 |
| 7,461,285 B2 * | | 12/2008 | Nervegna ............... 713/500 |
| 7,504,902 B2 * | | 3/2009 | Piasecki et al. ............... 331/176 |
| 7,505,540 B2 | | 3/2009 | Fernald |
| 7,649,425 B2 | | 1/2010 | Nervegna |
| 7,661,009 B2 * | | 2/2010 | Jarosinski ............... 713/500 |
| 7,818,528 B2 * | | 10/2010 | Hughes ............... 711/167 |
| 7,881,413 B2 | | 2/2011 | Nichols |
| 8,055,932 B2 * | | 11/2011 | Prihadi et al. ............... 713/600 |
| 2001/0034246 A1 * | | 10/2001 | Hutchison et al. ............... 455/557 |
| 2002/0125966 A1 * | | 9/2002 | Gunawardana et al. ............... 331/176 |
| 2002/0190764 A1 * | | 12/2002 | Nichols ............... 327/156 |
| 2003/0042989 A1 * | | 3/2003 | Sakurai ............... 331/175 |
| 2005/0243958 A1 | | 11/2005 | Fernald |
| 2006/0136770 A1 * | | 6/2006 | Jorgenson et al. ............... 713/500 |
| 2007/0250735 A1 * | | 10/2007 | Momii et al. ............... 713/500 |
| 2008/0294926 A1 | | 11/2008 | Eshraghian et al. |
| 2009/0259424 A1 | | 10/2009 | Dutta et al. |
| 2010/0077247 A1 * | | 3/2010 | McHarg et al. ............... 713/400 |
| 2010/0171659 A1 | | 7/2010 | Waters et al. |

FOREIGN PATENT DOCUMENTS

| | | | |
|---|---|---|---|
| EP | 1898527 A1 * | 3/2008 | |
| EP | 1933468 A1 * | 6/2008 | |
| EP | 1998451 A1 * | 12/2008 | |
| EP | 2101188 A1 * | 9/2009 | |
| GB | 2460538 A | 12/2009 | |
| JP | 54108599 A | 8/1979 | |
| JP | 55043455 A | 3/1980 | |
| JP | 58092885 A | 6/1983 | |
| JP | 02283140 A * | 11/1990 | |
| JP | 08097741 A * | 4/1996 | |
| JP | 2012037286 A * | 2/2012 | |
| WO | WO 03029836 A2 | 4/2003 | |

OTHER PUBLICATIONS

Dieguez, A.; Arbat, A.; Sanuy, A.; Casanova, R.; Rossinyol, M.; Samitier, J.; , "A Wake-Up Circuit With Temperature Compensated Clock in 1.2V-0.13 μm CMOS Technology," Electronics, Circuits and Systems, 2007. ICECS 2007. 14th IEEE International Conference on , pp. 367-370, Dec. 11-14, 2007.*

McCorquodale, M. S.; O'Day, J. D.; Pernia, S. M.; Carichner, G. A.; Kubba, S.; Brown, R. B.; , "A Monolithic and Self-Referenced RF LC Clock Generator Compliant With USB 2.0," Solid-State Circuits, IEEE Journal of , vol. 42, No. 2, pp. 385-399, Feb. 2007.*

Senger, R.M.; Marsman, E.D.; Carichner, G.A.; Kubba, S.; McCorquodale, M.S.; Brown, R.B.; , "Low-latency, HDL-synthesizable dynamic clock frequency controller with self-referenced hybrid clocking," Circuits and Systems, 2006. ISCAS 2006. Proceedings. 2006 IEEE International Symposium on , pp. 4 pp.-778, May 21-24, 2006.*

Actions on the Merits for parent U.S. Appl. No. 12/166,229, filed Jul. 1, 2008.

Tokunaga, Y.; Sakiyama, S.; Matsumoto, A.; Dosho, S.; "An On-Chip CMOS Relaxation Oscillator with Voltage Averaging Feedback," Solid-State Circuits, IEEE Journal of, vol. 45, No. 6, pp. 1150-1158, Jun. 2010.

Chen, D.Y.; Chan, P.K.;, "An Intelligent ISFET Sensory System with Temperature and Drift Compensation for Long-Term Monitoring," Sensors Journal, IEEE, vol. 8, No. 12, pp. 1948-1959, Dec. 2008.

Marins, C.; Kaufmann, P.; Ferreira, A.A.; Lopes, P.1-1.; de Paiva, M.C.; Vilela, R.M.; da Silveira, A.C.; "Precision Clock and Time Transfer on a Wireless Telecommunication Link," Instrumentation and Measurement, IEEE Transactions on, vol. 59, No. 3, pp. 512-518, Mar. 2010.

Falhi, A.; "Design of multi-sensors energy efficient reconfigurable embedded systems," Microelectronics, 2008. ICM 2008. International Conference on pp. 127-130, Dec. 14-17, 2008.

* cited by examiner

FIG. 16

| R/W | R/W | R/W | R/W | R/W | R/W | R/W | R/W | |
|---|---|---|---|---|---|---|---|---|
| - | | | | | | | | RESET VALUE VARIABLE SFR ADDRESS: 0xB3 |
| BIT7 | BIT6 | BIT5 | BIT4 | BIT3 | BIT2 | BIT1 | BIT0 | |

Bit7: UNUSED. Read=0. Write=don't care.
Bits 6-0: OSCICL: Internal Oscillator Calibration Register.
This register determines the internal oscillator period

FIG. 17

| R/W | R/W | R/W | R | R/W | R/W | R/W | R/W | |
|---|---|---|---|---|---|---|---|---|
| - | - | - | IFRDY | CLKSL | IOSCEN | IFCN1 | IFCN0 | RESET VALUE 00010100 SFR ADDRESS: 0xB2 |
| BIT7 | BIT6 | BIT5 | BIT4 | BIT3 | BIT2 | BIT1 | BIT0 | |

Bits7-5: UNUSED. Read=000b, Write=don't care.
Bit4: IFRDY: Internal Oscillator Frequency Ready Flag.
  0: Internal Oscillator is not running at programmed frequency.
  1: Internal Oscillator is running at programmed frequency.
Bit3: CLKSL: System Clock Source Select Bit.
  0: SYSCLK derived from the Internal Oscillator, and scaled as per the IFCN bits.
  1: SYSCLK derived from the External Oscillator circuit.
Bit2: IOSCEN: Internal Oscillator Enable Bit.
  0: Internal Oscillator Disabled.
  1: Internal Oscillator Enabled.
Bits1-0: IFCN1-0: Internal Oscillator Frequency Control Bits.
  00: SYSCLK derived from Internal Oscillator divided by 8.
  01: SYSCLK derived from Internal Oscillator divided by 4.
  10: SYSCLK derived from Internal Oscillator divided by 2.
  11: SYSCLK derived from Internal Oscillator divided by 1.

US 8,307,237 B2

PRECISION OSCILLATOR FOR AN ASYNCHRONOUS TRANSMISSION SYSTEM

CROSS-REFERENCE TO RELATED APPLICATIONS

This present application a Continuation of, claims priority to, and incorporates by reference in its entirety, U.S. patent Ser. No. 12/166,229 filed on Jul. 1, 2008 and entitled "Precision Oscillator for an Asynchronous Transmission System", issued on Nov. 8, 2011 and assigned U.S. Pat. No. 8,055,932, which is a Continuation of U.S. Pat. No. 7,395,447, issued Jul. 1, 2008, filed on Sep. 16, 2002, application Ser. No. 10/244,344, and entitled "PRECISION OSCILLATOR FOR AN ASYNCHRONOUS TRANSMISSION SYSTEM," which is related to U.S. patent application Ser. No. 09/885,459, filed Jun. 19, 2001 and entitled "FIELD PROGRAMMABLE MIXED-SIGNAL INTEGRATED CIRCUIT", now U.S. Pat. No. 7,171,542, issued on Jan. 30, 2007, which is incorporated herein by reference in its entirety and is related to U.S. Pat. No. 6,917,658, issued on Jul. 12, 2005, entitled "CLOCK RECOVERY METHOD FOR BURSTY COMMUNICATIONS," which is also incorporated herein by reference in its entirety.

TECHNICAL FIELD OF THE INVENTION

The present invention pertains in general to oscillators and, more particularly, to a precision oscillator utilized in a transmission system of the type associated with a UART.

BACKGROUND OF THE INVENTION

Universal, asynchronous transmitter/receivers (UARTs) are interface circuits, generally in the form of integrated circuit chips, which are disposed between a data providing circuit, such as, for example, a personal computer (PC) and a modem to provide parallel-to-serial and serial-to-parallel data conversion. Although UARTs can be stand-alone devices, they also can be incorporated into the communication port of a more complex integrated circuit chip. UARTs generally include an oscillator and a crystal to synchronize data conversion with a fairly precise oscillator frequency, which facilitates asynchronous communication between two remotely disposed UARTs. The purpose for having a crystal controlled oscillator is to ensure that the frequency of a specific UART is within a defined limit specified for UART operation. The use of a free-running oscillator will typically not be acceptable due to temperature drift, manufacturing tolerances, etc. Of course, crystals are typically external devices, thus requiring a more complex assembly.

SUMMARY OF THE INVENTION

The present invention disclosed and claimed herein, in one aspect thereof, comprises an integrated system on a chip with serial asynchronous communication capabilities. There is included processing circuitry for performing predefined digital processing functions on the chip and having an associated on chip free running clock circuit for generating a temperature compensated clock. An on-chip UART is provided for digitally communicating with an off-chip UART, which off-chip UART has an independent time reference, which communication between the on-chip UART and the off-chip UART is effected without clock recovery. The on-chip UART has a time-base derived from the temperature compensated clock. The temperature compensated clock provides a time reference for both the processing circuitry and the on-chip UART.

BRIEF DESCRIPTION OF THE DRAWINGS

For a more complete understanding of the present invention and the advantages thereof, reference is now made to the following description taken in conjunction with the accompanying Drawings in which:

FIGS. 16 and 17 illustrate tables for the oscillator controls.

DETAILED DESCRIPTION OF THE INVENTION

Figure 1:
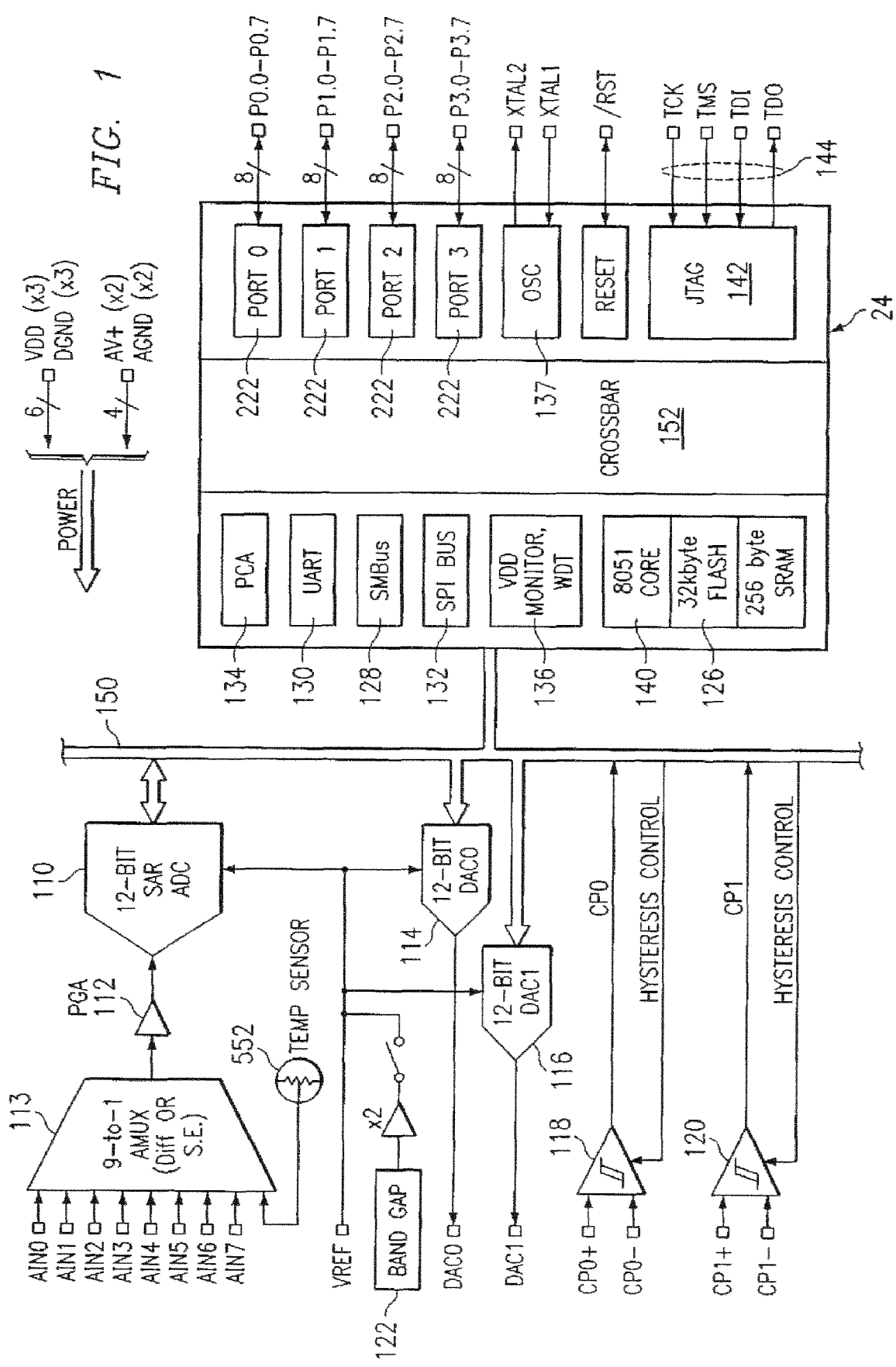
FIG. 1 illustrates an overall block diagram of a mixed-signal integrated circuit utilizing a UART in association with one of the communication ports.

Referring now to FIG. 1, there is illustrated an integrated circuit that is comprised of a fully integrated mixed-signal System on a Chip with a true 12-bit multi-channel ADC 110 with a programmable gain pre-amplifier s12, two 12-bit DACs 114 and 116, two voltage comparators 118 and 120, a voltage reference 22, and an 8051-compatible microcontroller core 124 with 32 kbytes of FLASH memory 126. There is also provided an I2C/SMBUS 128, a UART 130, and an SPI 132 serial interface 140 implemented in hardware (not "bit-banged" in user software) as well as a Programmable Counter/Timer Array (PCA) 134 with five capture/compare modules. There are also 32 general purpose digital Port I/Os. The analog side further includes a multiplexer 113 as operable to interface eight analog inputs to the programmable amplifier 112 and to the ADC 110.

With an on-board $V_{DD}$ monitor 136, WDT, and clock oscillator 137, the integrated circuit is a stand-alone System on a Chip. The MCU effectively configures and manages the analog and digital peripherals. The FLASH memory 126 can be reprogrammed even in-circuit, providing non-volatile data storage, and also allowing field upgrades of the 8051 firmware. The MCU can also individually shut down any or all of the peripherals to conserve power.

A JTAG interface 142 allows the user to interface with the integrated circuit through a conventional set of JTAG inputs 144. On-board JTAG emulation support allows non-intrusive (uses no on-chip resources), full speed, in-circuit emulation using the production integrated circuit installed in the final application. This emulation system supports inspection and modification of memory and registers, setting breakpoints, watchpoints, single stepping, run and halt commands. All analog and digital peripherals are fully functional when emulating using JTAG.

The microcontroller 140 is fully compatible with the MCS-51™ instruction set. Standard 803x/805x assemblers and compilers can be used to develop software. The core has all the peripherals included with a standard 8052, including three 16-bit counter/timers, a full-duplex UART, 256 bytes of internal RAM, 128 byte Special Function Register (SFR) address space, and four byte-wide I/O Ports.

Referring further to FIG. 1, the core 140 is interfaced through an internal BUS 150 to the various input/output blocks. A cross-bar switch 152 provides an interface between the UART 130, SPI BUS 132, etc., and the digital I/O output. This is a configurable interface. That can be associated with the $V_{DD}$ monitor 136.

The core 140 employs a pipelined architecture that greatly increases its instruction throughput over the standard 8051 architecture. In a standard 8051, all instructions except for MUL and DIV take 12 or 24 system clock cycles to execute with a maximum system clock of 12 MHz. By contrast, the core 140 core executes seventy percent (70%) of its instructions in one or two system clock cycles, with only four instructions taking more than four system clock cycles. The core 140 has a total of 109 instructions. The number of instructions versus the system clock cycles to execute them is as follows:

| Instructions | 26 | 50 | 5 | 14 | 7 | 3 | 1 | 2 | 1 |
|---|---|---|---|---|---|---|---|---|---|
| Clocks to Execute | 1 | 2 | 2/3 | 3 | 3/4 | 4 | 4/5 | 5 | 8 |

With the core 140's maximum system clock at 20 MHz, it has a peak throughput of 20 MIPS.

As an overview to the system of FIG. 1, the cross-bar switch 152 can be configured to interface any of the ports of the I/O side thereof to any of the functional blocks 128, 130, 132, 134 or 136 which provide interface between the cross-bar switch 152 and the core 140. Further, the cross-bar switch can also interface through these functional blocks 128-136 directly to the BUS 150.

Figure 2:
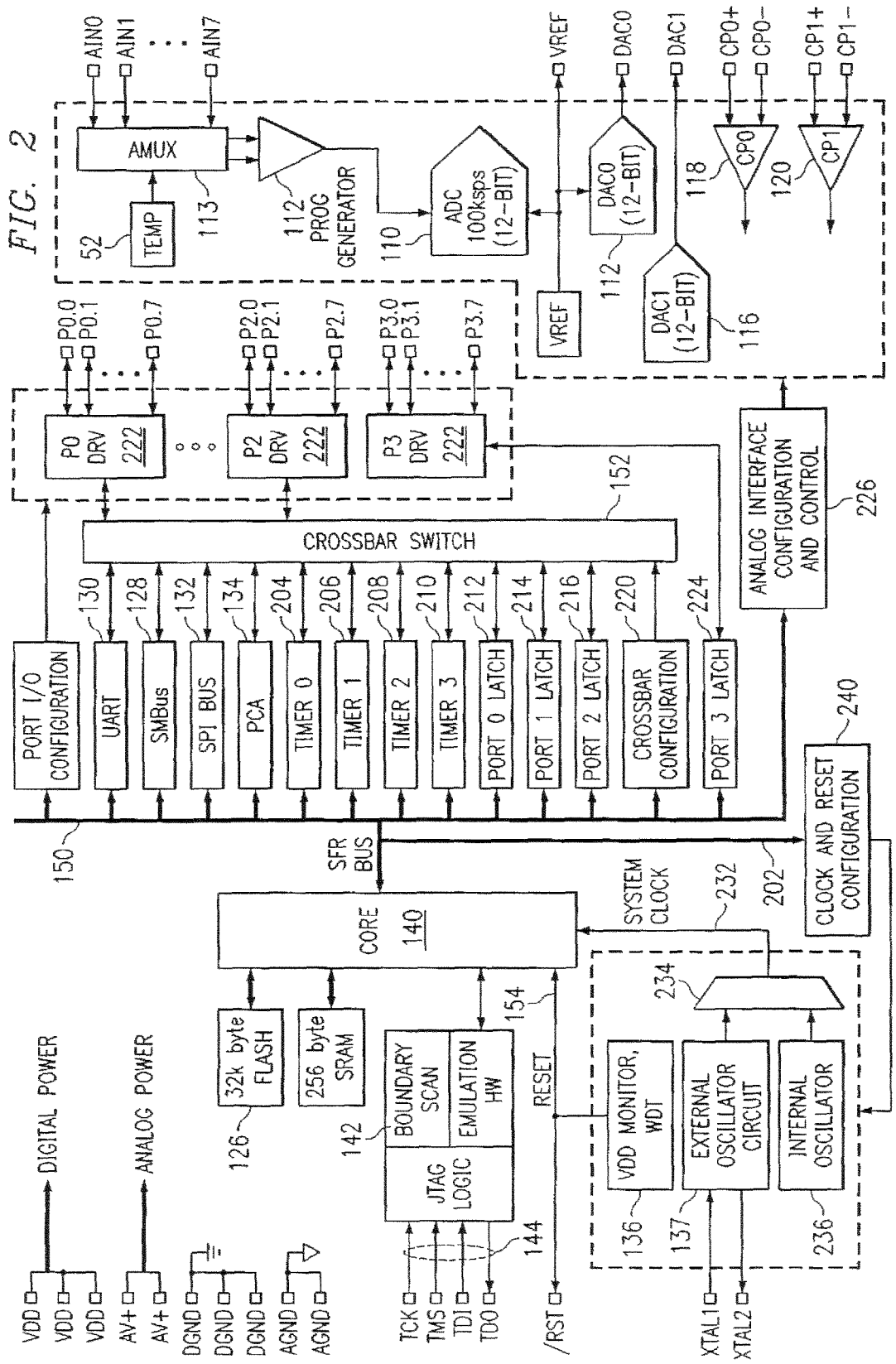
FIG. 2 illustrates a more detailed diagram of the integrated circuit of FIG. 1.

Referring now to FIG. 2, there is illustrated a more detailed block diagram of the integrated circuit of FIG. 1. In this embodiment, it can be seen that the cross-bar switch 152 actually interfaces to a system BUS 202 through the BUS 150. The BUS 150 is a BUS as operable to allow core 140 to interface with the various functional blocks 128-134 in addition to a plurality of timers 204, 206, 208 and 210, in addition to three latches 212, 214 and 216. The cross-bar switch 152 is configured with a configuration block 220 that is configured by the core 140. The other side of the cross-bar switch 152, the I/O side, is interfaced with various port drivers 222, which is controlled by a port latch 224 that interfaces with the BUS 150. In addition, the core 140 is operable to configure the analog side with an analog interface configuration in control block 226.

The core 140 is controlled by a clock on a line 232. The clock is selected from, as illustrated, one of two locations with a multiplexer 234. The first is external oscillator circuit 137 and the second is an internal oscillator 236. The internal oscillator circuit 236 is a precision temperature and supply compensated oscillator, as will be described hereinbelow. The core 140 is also controlled by a reset input on a reset line 154. The reset signal is also generated by the watchdog timer (WDT) circuit 136, the clock and reset circuitry all controlled by clock and reset configuration block 240, which is controlled by the core 140. Therefore, it can be seen that the user can configure the system to operate with an external crystal oscillator or an internal precision non-crystal non-stabilized oscillator that is basically "free-running." This oscillator 236, as will be described hereinbelow, generates the timing for both the core 140 and for the UART 130 timing and is stable over temperature.

Figure 3:
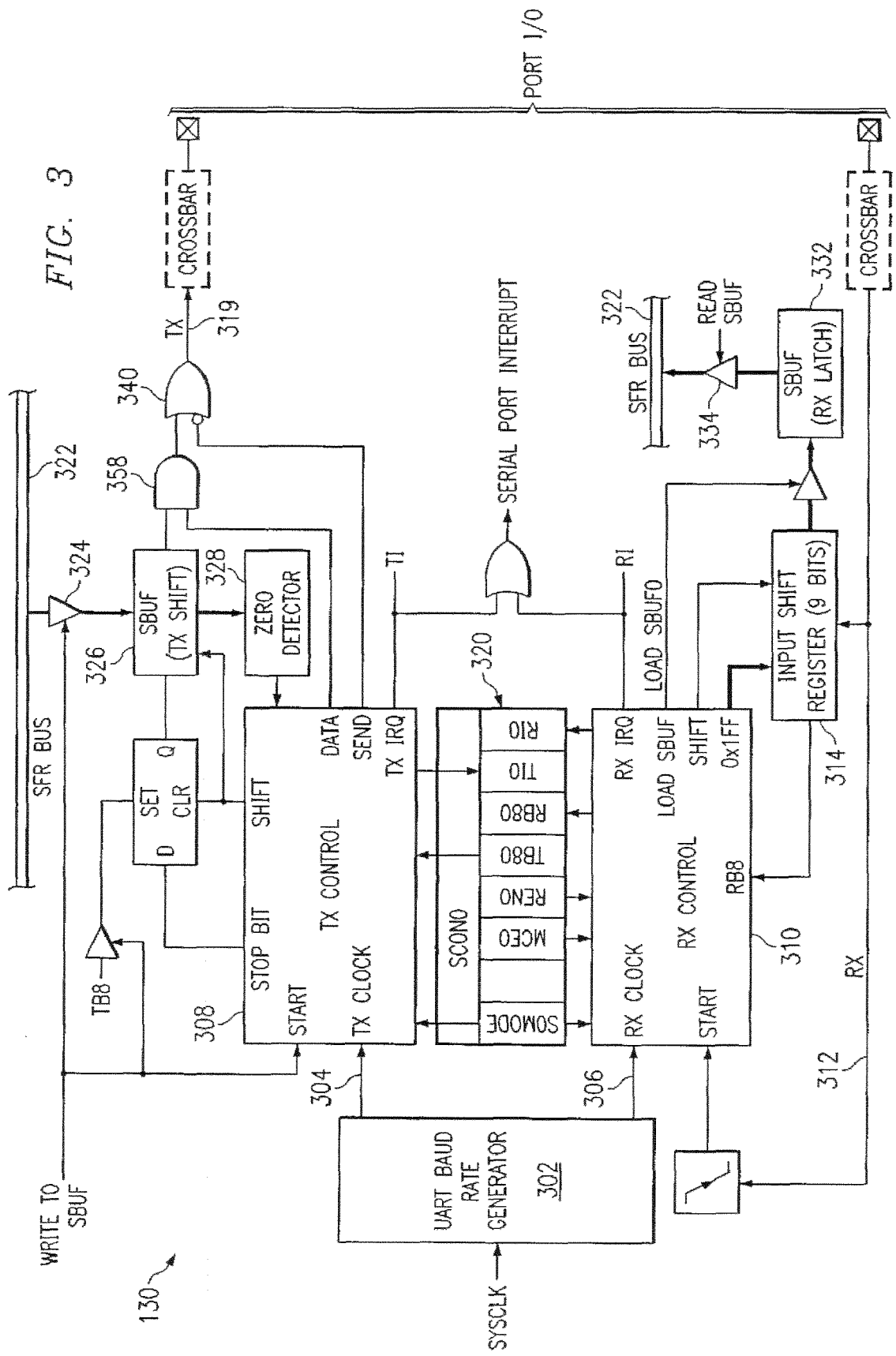
FIG. 3 illustrates a block diagram of the UART.

Referring now to FIG. 3, there is illustrated a block diagram of the UART 130. A system clock is input to a baud rated generator 302 which provides a transmit clock on the line 304 and a receive clock on a line 306. The transmit clock is input to a transmit control block 308 and the receive clock is input to a receive control block 310. A serial control register (SCON0) 320 is provided that is operable to provide control signals to the control blocks 308 and 310. The transmit data is received from a bus 322 and is input through a gate 324 to a serial data buffer (SBUF) 326. The output of this data is input to a zero detector 328 and then to a control block 308. The system is an asynchronous, full duplex serial port device and two associated special function registers, a serial control register (SCON0) 320 and a serial data buffer (SBUF0) (not shown), are provided. Data is received on a line 312 and is input to an input shift register 314. This is controlled by the control block 310 to output the shifted-in data to a latch 332 and then through a gate 334 to an SFR bus 322. In transmit mode, data is received from an SFR bus 321 and input through a gate 324 to a transmit shift register 326 which is output to a transmit line 319 from the register 326 or from the control block 308 through an AND gate 338 which is input to one input of an OR gate 340 to the transmit line 319. This is all controlled by the control block 308.

Figure 3A:
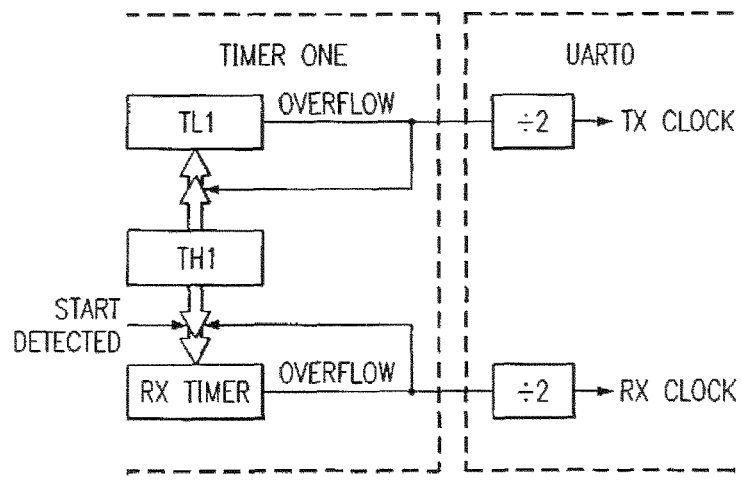
FIG. 3A illustrates a block diagram of the baud rate generator.

Referring now to FIG. 3A, there is illustrated a block diagram of the baud rate generator 302. This baud rate is generated by a timer wherein a transmit clock is generated by a block TL1 and the receive clock is generated by a copy of the TL1 illustrated as an RX Timer, which copy of TL1 is not user-accessible. Both the transmit and receive timer overflows are divided by two for the transmit clock and the receive clock baud rates. The receive timer runs when timer 1 is enabled, and uses the same TH1 value, this being a reload value. However, an RX Timer reload is forced when Start Condition is detected on the receive pin. This allows a receipt to begin any time a Start is detected, independent of the state of the transmit timer.

Figure 4:
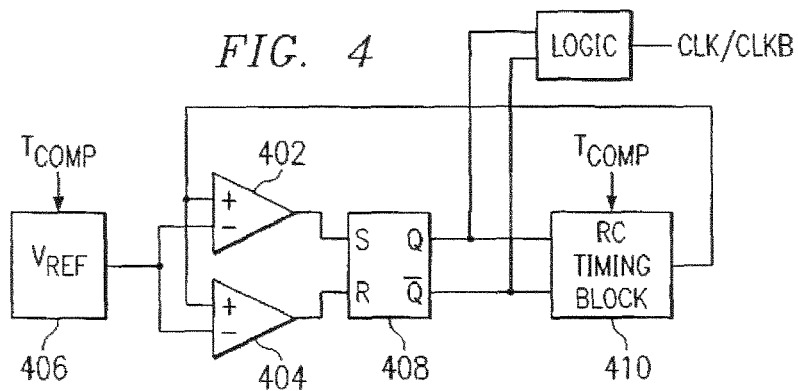
FIG. 4 illustrates a block diagram of the precision oscillator.

Referring now to FIG. 4, there is illustrated a diagrammatic view of the precision internal oscillator 236 that is disposed on integrated circuit. The integrated circuit, as noted hereinabove, is a commercially available integrated circuit that incorporates the precision oscillator 236 in association therewith. The integrated circuit provides the capability of selecting a crystal oscillator wherein a crystal is disposed between two crystal ports, selecting an external clock signal or selecting an internal free-running oscillator. The free-running oscillator is illustrated in FIG. 4 as the precision oscillator 236. At the center of the oscillator are two comparators, a first comparator 402 and a second comparator 404. A temperature compensated voltage reference circuit 406 is provided that provides a temperature compensated voltage reference (the trip voltage $V_{TRIP}$) to the negative inputs of the comparators 402. The outputs of the comparators 402 and 404 are connected to the Set and Reset, respectively, inputs of an S/R latch 408. The Q and Q-Bar outputs thereof are input to an output RC timing circuit 410 that is operable to define the period of the oscillator, the output of the S/R latch 408 providing the output clock signal. The output of this RC timing circuit 410 is fed back to the positive inputs of the comparators 402 and 404. The output RC timing circuit 410 is also temperature compensated. As will be described hereinbelow, the voltage reference block 406 provides a negative temperature coefficient, whereas the comparators 402 and S/R latch 408 combination provide a positive temperature coefficient and the output RC timing circuit 410 provide a positive temperature coefficient. The overall combined coefficient will be approximately zero, as will be described hereinbelow.

Figure 5:
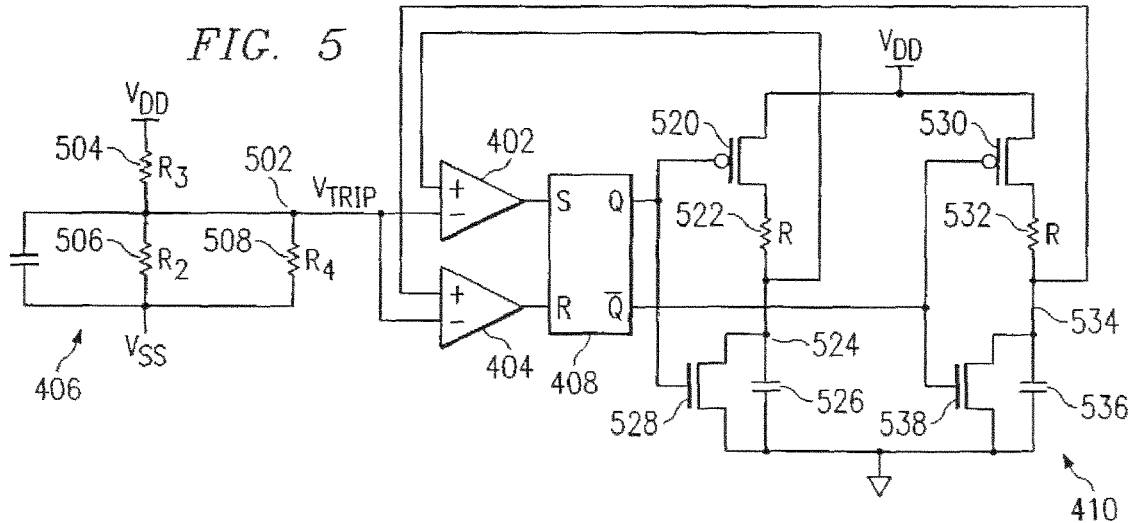
FIG. 5 illustrates a more detailed diagram of the precision oscillator of FIG. 4.

Referring now to FIG. 5, there is illustrated a more detailed diagrammatic view of the precision oscillator of FIG. 4. The voltage reference circuit 406 is comprised of a voltage divider that divides the supply voltage $V_{DD}$ to a voltage $V_{TRIP}$ on a node 502. The voltage divider is comprised of a top resistor 504 labeled $R_3$. The bottom half of the voltage divider is comprised of two parallel resistors, a resistor 506 labeled $R_2$ and a resistor 508 labeled $R_4$. For nomenclature purposes, the resistors will be referred as $R_2$, $R_3$ and $R_4$.

Resistors $R_3$ and $R_4$ are fabricated from the same material to provide a positive temperature coefficient. These are fabricated from the N-diffusion material, which has a positive temperature coefficient. By comparison, $R_2$ is manufactured from polycrystalline silicon in the first layer which is referred to as Poly1 material, and which also has a positive temperature coefficient, but which differs. It should be understood that different materials could be utilized, it only being necessary that there be two resistors having different temperature coefficients. Although not a part of this disclosure, Poly1 material is basically the first layer of polycrystalline silicon that is disposed on the substrate over a protective oxide layer, from which such structures as the gates of transistors are fabricated. With the positive temperature coefficients of the resistors, this will result in the voltage $V_{TRIP}$ having a negative coefficient. As will be described hereinbelow, the resistors being of different materials facilitates adjustments between the two resistors $R_2$ and $R_4$ to vary the temperature coefficient. This is primarily due to the fact that they are of differing materials.

Figure 6:
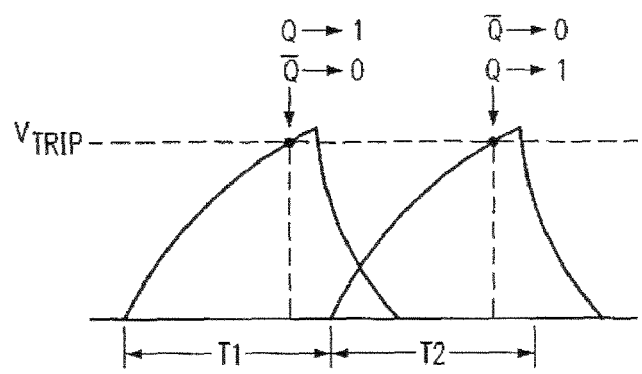
FIG. 6 illustrates an output waveform diagram of a precision oscillator.

The output RC timing circuit 410 is comprised of two RC circuits. The first RC circuit is comprised of a P-channel transistor 520 having the source/drain path thereof connected between $V_{DD}$ and one side of a resistor 522 labeled R, the other end thereof connected to a node 524. Node 524 is connected to one side of a capacitor 526, the other side of the capacitor 526 connected to $V_{SS}$. An n-channel transistor 528 has the source/drain path thereof connected across capacitor 526, and the gate thereof is connected to the gate of P-channel transistor 520 and also to the Q-output of the S/R latch 408. Node 524 comprises the positive input of the comparator 402. The second RC network is comprised of a P-channel transistor 530 having the source/drain path thereof connected between $V_{DD}$ and one side of a resistor 532 (labeled R), the other side of resistor 532 connected to a node 534. Node 534 is connected to one side of a capacitor 536, the other side thereof connected to $V_{SS}$. An N-channel transistor 538 has the source/drain path thereof connected between node 534 and $V_{SS}$. The gate of transistor 538 is connected to the gate of transistor 530 and also to the Q-Bar output of S/R latch 408. The node 534 comprises the positive input of the comparator 404. The output waveform for the circuit of FIG. 5 is illustrated in FIG. 6, wherein conventional RC rise and fall curves are illustrated for each of the RC circuits. The period of each output waveform is defined from the initial turn-on point where voltage is applied to the resistor R to the point where resistor R of the other of the RC circuits is turned on. There will be period T1 and a period T2 for each of the RC circuits, respectively. The sum of the two periods is equal to the period for the oscillator. Transistors 520, 530, 528 and 538 are sized such that their resistances are substantially less than the value of resistors 522 and 532. The resistors 522 and 532 are fabricated from Poly1 material due to its low temperature coefficient. The period of the oscillator is the sum of the period T1 and the period T2 plus two times the delay of the comparators.

Figure 7:
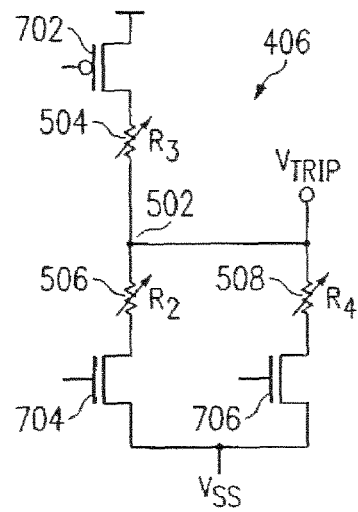
FIG. 7 illustrates a schematic diagram of the temperature compensated reference voltage.

Referring now to FIG. 7, there is illustrated more detailed block diagram of the implementation of the voltage reference 406. The resistor 504 which is illustrated in FIG. 5 as being connected to $V_{DD}$ is actually connected through the source/drain of the P-channel resistor 702 to $V_{DD}$ with the gate thereof connected to a bias voltage. Similarly, the bottom end of resistor 506 is connected to $V_{SS}$ through the source/drain path of a N-channel transistor 706 to $V_{SS}$, the gates of both transistors 704 and 706 connected to a bias. Transistors 702, 704 and 706 are sized such that their resistances are substantially less than the value of resistors $R_2$, $R_3$ and $R_4$. Also, first order power supply independence comes from the fact that the trip voltage $V_{TRIP}$ is proportional to the supply voltage, i.e., $V_{DD}*(1-e(t/\tau))$. Therefore, in the time it takes to reach the trip voltage at the input of the comparator is supply independent to the first order. This is one reason that the RC timing circuits are utilized rather than a current source charging a capacitor, which does not provide the first order cancellation.

$$V_{TRIP} = V_{DD} * \text{ratio}$$

$$V_{TRIP} = V_{DD} * (1 - e(-T1/\tau))$$

$$T1 = -\tau * \ln(1 - V_{TRIP}/V_{DD})$$

Thus: $T1 = -\tau * \ln(1-\text{ratio})$

From a temperature compensation standpoint, there are a number of aspects of the voltage reference circuit 406 that can be utilized to provide temperature compensation. Commonly, the resistors have a set variation with respect to temperature. The Poly1 resistor $R_2$ has a temperature coefficient of 255 ppm whereas the N-diffused resistors $R_3$ and $R_4$ have a temperature coefficient of 800 ppm. In the present disclosure, it is desirable to have a negative coefficient of 462 ppm.

To analyze how a negative temperature coefficient is created with the resistors $R_2$, $R_3$ and $R_4$, consider that $R_2$ and $R_4$ are a parallel combination defined as $REQ=R_2//R_4$. If REQ and $R_3$ have different temperature coefficients with $TCR_3 > TCREQ$, then the trip voltage will have a negative temperature coefficient. $V_{TRIP}$ will be defined as follows:

$$V_{TRIP} = \frac{REQ}{R_3 + REQ} V_{DD}$$

$$\frac{1}{V_{TRIP}} \frac{dV_{TRIP}}{dT} =$$

$$\frac{1}{REQ} \frac{dREQ}{dT} - \frac{R_3}{R_3 + REQ} \left[ \frac{1}{REQ} \frac{dREQ}{dT} \right] - \frac{R_3}{R_3 + REQ} \left[ \frac{1}{R_3} \frac{dR_3}{dT} \right]$$

$$\frac{1}{V_{TRIP}} \frac{dV_{TRIP}}{dT} = \frac{R_2}{R_3 + REQ} [TCREQ - TCR_3]$$

For REQ, is must be assumed that $V_{TRIP}$ is a fixed value, such that $R_2$ and $R_4$ can be varied to target a specific temperature coefficient. This can be shown by the following equations:

$$\frac{1}{REQ}\frac{dREQ}{dT} = \left[\frac{1}{R_2}\frac{dR_2}{dT}\right] + \left[\frac{1}{R_4}\frac{dR_4}{dT}\right] -$$
$$\frac{R_2}{R_2+R_4}\left[\frac{1}{R_2}\frac{dR_2}{dT}\right] - \frac{R_4}{R_2+R_4}\left[\frac{1}{R_4}\frac{dR_4}{dT}\right]$$
$$TCREQ = TCR_2 + TCR_4 - \frac{R_2}{R_2+R_4}TCR_2 - \frac{R_4}{R_2+R_4}TCR_4$$

The results of equation 5 can be utilized in equation 3 to set the final temperature coefficient of $V_{TRIP}$.

Figure 8:
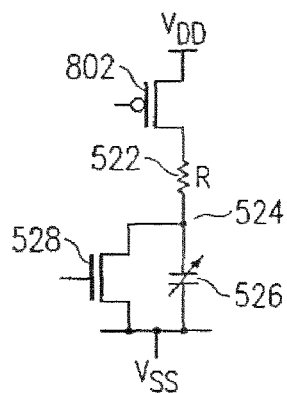
FIG. 8 illustrates a schematic diagram of one-half of the output wave shaping circuit.

Referring now to FIG. 8, there is illustrated a detailed diagram of the implementation of one-half of the charging structure 410. This, as with the case with respect to the voltage reference structure 406, there is provided a P-channel transistor 802 for connecting the top end of the resistor 522 to $V_{DD}$, with the gate thereof connected to a bias supply. This P-channel transistor introduces very little error in the temperature operation thereof. Capacitor 526 is a variable capacitor, such that the value thereof can be varied to set the period for the oscillator. The capacitor 526 is fabricated from an insulator disposed between the first layer poly, P1, and the second layer poly, P2, with a layer of oxide disposed therebetween. The resistor 522 is an N-diffusion resistor.

The resistors $R_3$, $R_2$ and $R_4$ in the voltage reference circuit 406 are variable resistors that can be mask programmable resistors. Resistor $R_3$ is utilized to set the value of $V_{TRIP}$ and resistors $R_2$ and $R_4$ are utilized to select a temperature coefficient, since they have dissimilar temperature coefficients.

Figure 9:
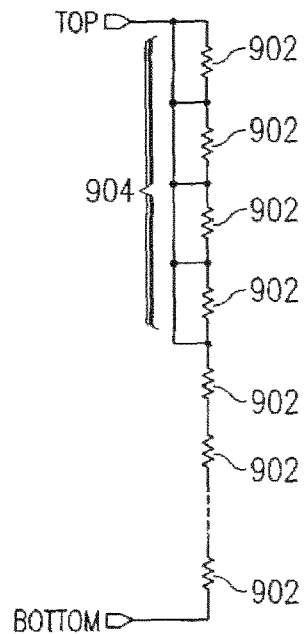
FIG. 9 illustrates a schematic diagram/layout for one of the resistors illustrating the mask programmable feature thereof.

FIG. 9 illustrates a layout for one of the resistors $R_2$-$R_4$. A plurality of series connected resistors are provided that are fabricated in either the substrate with an N-type diffusion or in the Poly1 layer. These resistors provide a mask programmable set of connections 904 to allow one or more resistors 902 to be added into the resistor string, they being initially shorted out. Although not shown, there is also provided the ability to short additional ones of the resistors to decrease the value. This is mask programmable and is utilized to "tweak" the design at the metal level.

Figure 10:
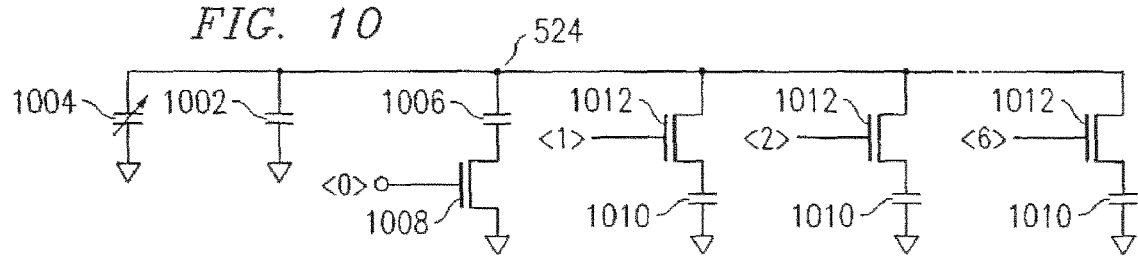
FIG. 10 illustrates a schematic diagram of the programmable capacitor.

Referring now to FIG. 10, there is illustrated a diagrammatic view of the capacitor 526, which is a register programmable capacitor to allow for adjustment of the center frequency. There is provided a nominal capacitor 1002 which has a value of 380 fF, which is connected between node 24 and $V_{SS}$. In parallel therewith, there is also provided a mask programmable capacitor 1004 that provides for eight steps of programming in increments of 39.5 fF. The register programmable capacitors are provided with a capacitor 1006 of value "C" that is connected between a node 524 and one side of the source/drain path of an N-channel transistor 1008, the gate thereof connected to the LSB bit. The configuration of the capacitor 1006 disposed between the switching transistor 1008 and the node 524 is only used for LSB. This structure allows the use of the smaller unit capacitor, but there is some non-linear capacitance that is introduced from the source/drain of the transistor 1008 and, also, the wire bonds. The remaining selectable capacitors are each comprised of a capacitor 1010 which is connected between $V_{SS}$ and one side of the source/drain path of an N-channel transistor 1012, the other side thereof connected to node 524 and the gate thereof connected to the bits [1] through [6]. The value of the capacitor 1010 associated with bit <1> is a value of "C", with the next selectable capacitor 1010 having the associated transistor gate connected to the bit value <2> and the last of the selectable capacitor 1010 having the gate of the associated transistor connected to the bit <6> and a value of 32 C. This is a binary tree, with the LSB providing an LSB of approximately C/2.

Figure 11:
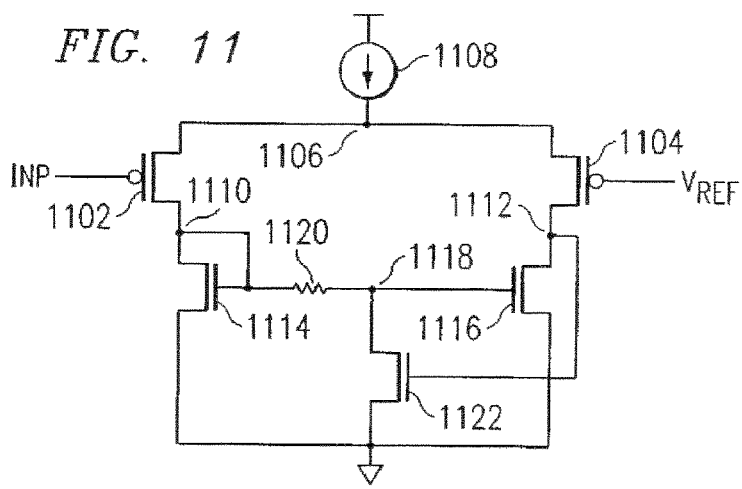
FIG. 11 illustrates a schematic diagram of the comparator.

Referring now to FIG. 11, there is illustrated a diagrammatic view of the differential input structure for each of the comparators 402 and 404. There are provided two differential P-channel transistors 1102 and 1104 having one side of the source/drain paths thereof connected to a node 1106, node 1106 connected through a current source 1108 to $V_{DD}$. The other side of the source/drain path of transistor 1102 is connected to a node 1110 and the other side of the source/drain path of transistor 1104 is connected to a node 1112. The gate of transistor 1102 comprises the positive input and the gate of transistor 1104 comprises the negative input connected to $V_{REF}$. Node 1110 is connected to one side of the source/drain path of an N-channel transistor 1114 and the gate thereof, the other side of the source/drain path of transistor 1114 connected to $V_{SS}$. Node 1112 is connected to one side of the source/drain path of an N-channel transistor 1116, the other side thereof connected to $V_{SS}$ and the gate thereof connected to a node 1118, node 1118 connected to one side of a resistor 1120, the other side thereof connected to the gate of transistor 1114. Node 1112 is also connected to the gate of an N-channel transistor 1122, the source/drain path thereof connected between node 1118 and $V_{SS}$. This structure is referred to as a modified Flynn-Lidholm latching comparator which provides a Set/Reset latch with dynamic logic, described in Flynn M. Lidholm S. U., "A 1.2 µm CMOS Current Controlled Oscillator, IEEE Journal of Solid state Circuits," Vol. 27 No. 7 Jul. 1992.

Figure 12:
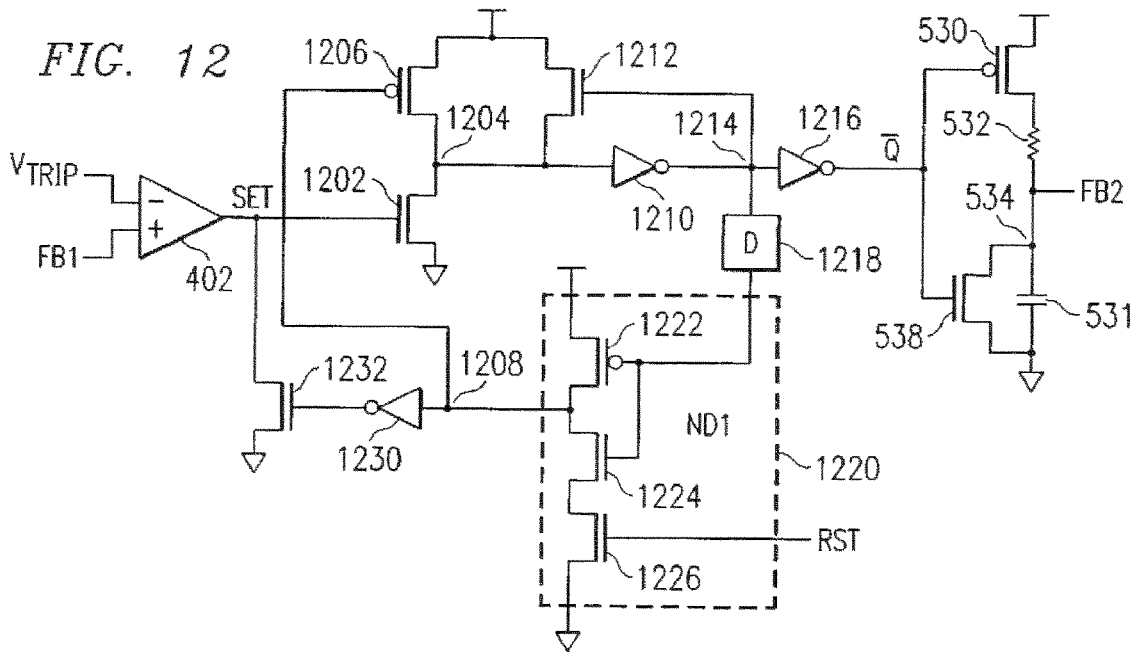
FIG. 12 illustrates a logic diagram for the S/R latch in combination with the comparator.

Referring now to FIG. 12, there is illustrated a diagrammatic view of the comparator 402 and one-half of the S/R latch 408 illustrating the Q-Bar output. The one-half of the S/R latch 408 has the Set input thereof connected to the output of comparator 402 and input to the gate of an N-channel transistor 1202, the source/drain path thereof connected between a node 1204 and $V_{SS}$. A P-channel transistor 1206 has the source/drain path thereof connected between node 1204 and $V_{DD}$, the gate thereof connected to a node 1208. Node 1204 is connected to the input of a conventional inverter 1210 and also to one side of the source/drain path of an N-channel transistor 1212, the other side thereof connected to $V_{DD}$ and the gate thereof connected to a node 1214, which node 1214 is also connected to the output of inverter 1210. Node 1214 is connected to the input of an inverter 1216, the output thereof providing the Q-Bar output. Node 1214 also is connected through a delay block 1218 to the input of a NAND gate 1220 labeled "ND1." NAND gate 1220 is comprised of a P-channel transistor 1222 having the source/drain path thereof connected between $V_{SS}$ and the node 1208 and an N-channel transistor 1224 having the source/drain path thereof connected between the node 1204 and one side of the source/drain path of an N-channel transistor 1226, the other side thereof connected to $V_{SS}$. The gates of transistors 1222 and 1224 are connected to the output of the delay block 1218. The gate of transistor 1226 is connected to the reset input "RST" from the other side of the S/R latch 408. Node 1208 is connected to the input of an inverter 1230, the output thereof driving the gate of an N-channel transistor 1232 having the source/drain path thereof connected between the output of the comparator 402, the SET input of latch 408, and the other side of the source/drain path of transistor 1232 connected to $V_{SS}$. The parallel structure to that associated with the output of comparator 402 in FIG. 12 is provided for the output of comparator 404 for the Reset input.

In operation, when the positive input of comparator 402, FB1, charges up, SET starts to go high. As it reaches the threshold voltage $V_{TH}$ of transistor 1202, Q-Bar begins to go low and, at the same time, the other side of the latch, which has a NAND gate ND2 similar to ND1, begins to go low and pulls down RST. When RST is pulled down, this then sets the Q-output. Initially, it is assumed that Q-Bar is set to a value of "1" and the Q-output is set to "0" with FB1 equaling "0" on comparator 402 and FB2 on the positive input of comparator 404 being initially set to "1" with SET=0 and RST=1. The delay block 1218 prevents ND1 from pulling down the SET value before RST goes low. RST going low ensures that the pull down input is low (or ND1 high) to result in a symmetric process for SET/RST.

Figure 13:
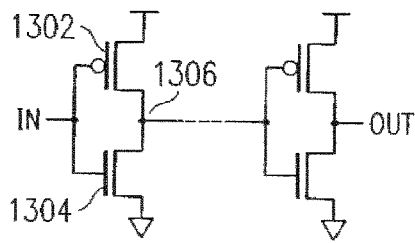
FIG. 13 illustrates a schematic diagram of the delay block.

Referring now to FIG. 13, there is illustrated a schematic diagram of the delay block 1218. This delay block is comprised of a plurality of series connected inverters comprised of two series connected transistors, a P-channel transistor 1302 and an N-channel transistor 1304, with the gates thereof connected together and one side of the source/drain path thereof connected to a node 1306, transistor 1302 connected between $V_{DD}$ and $V_{SS}$.

Figure 14:
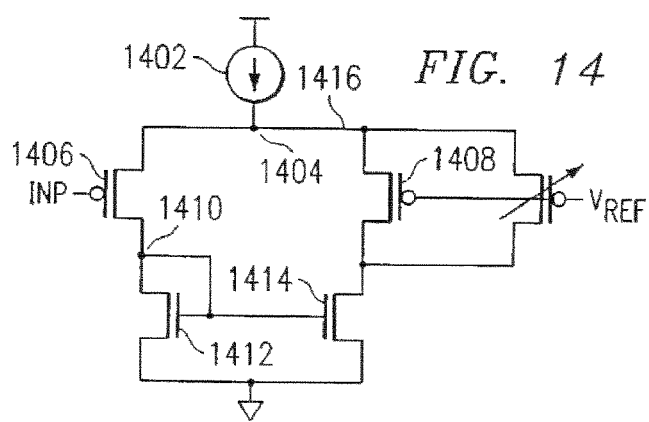
FIG. 14 illustrates a schematic diagram for an offset circuit for the comparator.

Referring now to FIG. 14, there is illustrated a diagrammatic view of a simplified comparator illustrating how supply independence is enhanced. The comparator of FIG. 14 is illustrated with a current source 1402 disposed between $V_{DD}$ and a node 1404, node 1404 connected to one side of two differential connected P-channel transistors 1406 and 1408. The gate of transistor 1406 is connected to one input, whereas the gate of transistor 1408 is connected to the other $V_{REF}$ input. The other side of the source/drain path of transistor 1406 is connected to a node 1410, which is connected to one side of the source/drain path of an N-channel 1412, the other side thereof connected to ground and the gate thereof connected to both the drain thereof on node 1410 and to the gate of an N-channel transistor 1414. Transistor 1414 has the source/drain path thereof connected between the other side of transistor 1408 and $V_{SS}$. Additionally, an offset transistor(s) 1416 of the P-channel type has the source/drain path thereof connected across the source/drain path of transistor 1408, the gate thereof connected to $V_{REF}$ and also to the gate of transistor 1408. Transistor 1416 represents selectable transistors that are mask programmable to select a predetermined offset in the comparator. This offset at the input of the comparators aid in the supply independence. Without offset, the following would be true:

With Offset:

$T_{Period}=2*(-\tau \ln(1-V_{TRIP}/V_{DD})+T_{Delay(comp)})$ $T_{Period}=2*(-\tau*\ln(1-\text{ratio})+T_{Delay(comp)})$ $V_{TRIP}=\text{ratio}*V_{DD}$ Without Offset:

$V_{TRIP}=V_{TRIP}+V_{OS}$ $T_{Period}=2(-\tau*\ln(1-\text{ratio}-V_{OS}/V_{DD})+T_{Delay(comp)})$ From these equations, it can be seen that $V_{DD}$ dependence has been added. Power supply dependence can be added or subtracted by varying the transistors 1416, noting that there could be variable transistors across transistor 1406 also. This way, the offset can be made negative or positive. Again, this is a mask programmable system.

Figure 15:
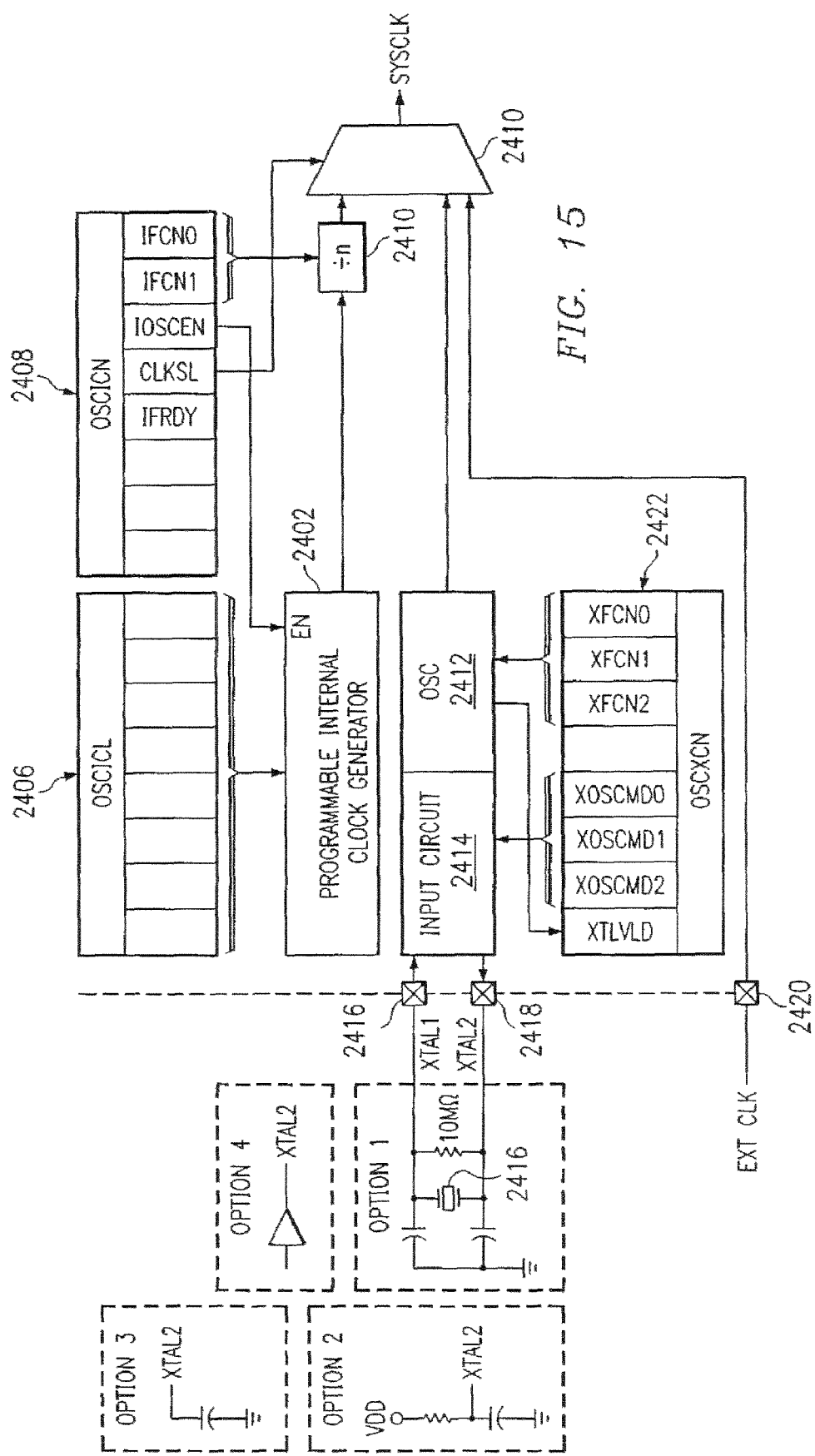
FIG. 15 illustrates a block diagram of one instantiation of the oscillator.

Referring now to FIG. 15, there is illustrated a diagrammatic view of one instantiation of the precision oscillator. In the oscillator implemented on the integrated circuit, a programmable internal clock generator 2402 is provided that is controlled by a register 2406 and a register 2408. The output of the internal clock generator is input to a divide circuit 2410, which is also controlled by the register 2408, the output thereof being input to one input of a multiplexer 2410. This multiplexer 2410 is controlled by the register 2408. Register 2410 outputs the system clock (SYSCLK), which is input to the baud rate generator 302. In addition to an internal clock generator, there is also a provision for an external crystal controlled oscillator. A crystal controlled internal or on-chip oscillator 2412 is provided that is interfaced through an input circuit 2414 to terminals 2416 and 2418 to an external crystal 2416. The output of the oscillator 2412 is input to one input of the multiplexer 2410. Additionally, an external clock is provided on a terminal 2420 that is also input to one input of the multiplexer 2410. The crystal controlled oscillator 2412 is controlled by a register 2422.

The internal oscillator 2402 is provided such that it will be the default system clock after a system reset. The internal oscillator period can be programmed with the register 2406 by the following equation:

$$\Delta T \cong 0.0025 \times \frac{1}{f_{BASE}} \times \Delta OSCICL$$

wherein $f_{BASE}$ is a frequency of the internal oscillator followed by a reset, $\Delta T$ is the change in internal oscillator, and $\Delta OSCICL$ is a change to the value held in the register 2406. Typically, the register 2406 will be factory calibrated to a defined frequency such as, in one example, 12.0 MHz.

Referring now to FIG. 16, there is illustrated a table for register 2406 wherein it can be seen that bits 6-0 are associated with the calibration register of the oscillator and its value can be changed internally. FIG. 17 illustrates the control register 2408 illustrating the controls provided therefor.

Although the preferred embodiment has been described in detail, it should be understood that various changes, substitutions and alterations can be made therein without departing from the spirit and scope of the invention as defined by the appended claims.

What is claimed is:

1. An integrated system on a chip with serial asynchronous communication capabilities, comprising:
   a clock circuit integrated on the chip for generating a temperature compensated clock without a synchronization signal from an external source, the clock circuit comprises:
   a switching circuit to switch between first and second logic states responsive to a control signal, the switching circuit having a temperature profile associated therewith; and
   a signal generator to provide the control signal that is compensated over temperature to offset the temperature profile of the switching circuit to provide the temperature compensated clock; and
   an Asynchronous Universal Receiver Transmitter (UART) integrated on the chip and coupled to the clock circuit, the UART configurable to communicate digitally with a bus for transmitting data and for receiving data without clock recovery, said UART having a time base derived from said temperature compensated clock and independent of timing information in the data received during a receive operation.

2. The integrated system on a chip of claim 1, further comprising:
   a central core processor for performing predefined digital processing functions on the chip;

wherein the temperature compensated clock provides a time reference for the central core processor.

3. The integrated system on a chip of claim 1, wherein the UART is operable to transmit data and receive data asynchronously using the time base derived from the temperature compensated clock.

4. The integrated system on a chip of claim 1, wherein the signal generator includes at least two resistive devices.

5. The integrated system on a chip of claim 4, wherein the at least two resistive devices have different temperature coefficients.

6. The integrated system on a chip of claim 1, wherein the signal generator comprises:
    a first supply terminal;
    a second supply terminal;
    a first resistive device including a first terminal and a second terminal, the first terminal coupled to the first supply terminal;
    a second resistive device including a first terminal coupled to the second terminal of the first resistive device and including a second terminal coupled to the second supply terminal; and
    a third resistive device coupled in parallel with the second resistive device.

7. The integrated system on a chip of claim 6, wherein the second and third resistive devices are operable to set a temperature coefficient to offset the temperature profile.

8. The integrated system on a chip of claim 6, wherein the first resistor sets a threshold value for the signal generator to vary the control signal.

9. The integrated system on a chip of claim 8, wherein the switching circuit comprises:
    a comparator circuit including a first comparator and a second comparator, each of the first and second comparators including a reference input, a second input for receiving a feedback signal, and a reference output, the reference input to receive the control signal, the reference output to provide an output signal, the output signal of each of said first and second comparators changing logic states between a first logic state and a second logic state when the feedback signal exceeds the control signal; and
    an RC timing circuit having a time constant configured to control timing of the receiving of the feedback signal at the second input of each of the first and second comparators to control when the output signals switch.

10. An integrated system on a chip comprising:
    a clock circuit for generating a temperature compensated clock without a synchronization signal from an external source, the clock circuit including at least two resistive devices having different temperature coefficients configured to provide temperature compensation, the clock circuit comprises:
        a switching circuit to switch between first and second logic states responsive to a control signal, the switching circuit having a temperature profile associated therewith; and
        a signal generator to provide the control signal that is compensated over temperature to offset the temperature profile of the switching circuit to provide the temperature compensated clock; and
    an Asynchronous Universal Receiver Transmitter (UART) coupled to the clock circuit and configurable to communicate digitally with a bus using a time base derived from the temperature compensated clock for transmitting data and for receiving data without clock recovery.

11. The integrated system on a chip of claim 10, wherein the signal generator comprises:
    a first supply terminal;
    a second supply terminal;
    a first resistive device including a first terminal and a second terminal, the first terminal coupled to the first supply terminal;
    a second resistive device including a first terminal coupled to the second terminal of the first resistive device and including a second terminal coupled to the second supply terminal; and
    a third resistive device coupled in parallel with the second resistive device.

12. The integrated system on a chip of claim 11, wherein the second and third resistive devices are operable to set a temperature coefficient to offset the temperature profile.

13. The integrated system on a chip of claim 11, wherein the first resistor sets a threshold value for the signal generator to vary the control signal.

14. The integrated system on a chip of claim 10, wherein the switching circuit comprises:
    a comparator circuit comprising:
        a first comparator including a reference input for receiving the control signal, a second input, and a reference output for providing a first output signal;
        a second comparator including a reference input for receiving the control signal, a second input, and a reference output for providing a second output signal; and
        an RC timing circuit configured to provide a signal to the second input of each of the first and second comparators; and
    wherein the first output signal and the second output signal change logic states between a first logic state and a second logic state when the signal exceeds the control signal.

15. The integrated system on a chip of claim 14, wherein the RC timing circuit controls a frequency of the clock circuit.

16. The integrated system on a chip of claim 15, wherein the RC timing circuit comprises:
    a first RC circuit and a second RC circuit, each of the first RC circuit and said second RC circuit comprising:
        a resistor including a first terminal coupled to a first supply terminal and including a second terminal;
        a switch including a first switch terminal, a control terminal, and a second switch terminal, the first switch terminal coupled to the second terminal of the resistor;
        a capacitor including a first current electrode coupled to the second switch terminal and including a second current electrode coupled to a second supply terminal; and
        wherein the switch is operable to switch a current through the resistor to charge the capacitor; and
    the control terminal of the switch of the first RC circuit is coupled to the output of the second comparator;
    the control terminal of the switch of the second RC circuit is coupled to the output of the first comparator; and
    wherein the charging of the capacitors controls a voltage at the second input of the first and second comparators; and
    wherein one of the first and second comparators switches when the voltage on the second input of the one exceeds the control signal.

17. An integrated circuit comprising:
    a clock circuit for generating a temperature compensated clock without a synchronization signal from an external source, the on-chip clock circuit comprising:

a switching circuit to switch between first and second logic states responsive to a control signal, the switching circuit having a temperature profile associated therewith; and a signal generator to provide the control signal that is compensated over temperature to offset the temperature profile of the switching circuit to provide the temperature compensated clock; and an Asynchronous Universal Receiver Transmitter (UART) configurable to communicate digitally with a bus using a time base derived from said temperature compensated clock for transmitting data and for receiving data without clock recovery, which time base is independent of timing information in the data received during a receive operation.

18. The integrated circuit of claim 17, wherein:

the signal generator comprises:
- a first supply terminal;
- a second supply terminal;
- a first resistive device including a first terminal and a second terminal, the first terminal coupled to the first supply terminal;
- a second resistive device including a first terminal coupled to the second terminal of the first resistive device and including a second terminal coupled to the second supply terminal; and
- a third resistive device coupled in parallel with the second resistive device; and the switching circuit comprises:
- a comparator circuit comprising:
  - a first comparator including a reference input for receiving the control signal, a second input, and a reference output for providing a first output signal;
  - a second comparator including a reference input for receiving the control signal, a second input, and a reference output for providing a second output signal; and
  - an RC timing circuit configured to provide a signal to the second input of each of the first and second comparators; and wherein the first output signal and the second output signal change logic states between a first logic state and a second logic state when the signal exceeds the control signal.

* * * * *